(12) United States Patent
Lin et al.

(10) Patent No.: US 9,780,064 B2
(45) Date of Patent: Oct. 3, 2017

(54) METHOD OF FORMING PACKAGE ASSEMBLY

(71) Applicant: TAIWAN SEMICONDUCTOR MANUFACTURING COMPANY, LTD., Hsinchu (TW)

(72) Inventors: Hung-Jen Lin, Tainan (TW);
Tsung-Ding Wang, Tainan (TW);
Chien-Hsiun Lee, Chu-tung Town (TW); Wen-Hsiung Lu, Jhonghe (TW);
Ming-Da Cheng, Jhubei (TW);
Chung-Shi Liu, Hsinchu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

(21) Appl. No.: 14/713,476

(22) Filed: May 15, 2015

(65) Prior Publication Data

US 2015/0249066 A1  Sep. 3, 2015

Related U.S. Application Data

(62) Division of application No. 13/427,787, filed on Mar. 22, 2012, now Pat. No. 9,059,109.

(Continued)

(51) Int. Cl.
*H01L 23/00* (2006.01)
*H01L 23/31* (2006.01)
(Continued)

(52) U.S. Cl.
CPC ............ *H01L 24/81* (2013.01); *H01L 21/563* (2013.01); *H01L 21/565* (2013.01); *H01L 21/566* (2013.01); *H01L 21/768* (2013.01); *H01L 23/3114* (2013.01); *H01L 23/3171* (2013.01); *H01L 24/11* (2013.01); *H01L 23/525* (2013.01);
(Continued)

(58) Field of Classification Search
CPC ..... H01L 24/81; H01L 23/317; H01L 21/563;
H01L 24/13; H01L 2224/13022; H01L 2224/024; H01L 24/03; H01L 24/05;
H01L 24/11; H01L 24/16; H01L 24/27;
H01L 24/29; H01L 24/83; H01L 24/92;
(Continued)

(56) References Cited

U.S. PATENT DOCUMENTS 6,180,696 B1  1/2001  Wong et al.
6,281,581 B1  8/2001  Desai et al.
(Continued)

OTHER PUBLICATIONS

Kolbeck, Anton et al., "No-Flow Underfill Process for Flip-Chip Assembly", 14th European Microelectronics and Packaging Conference & Exhibition, Friedrichshafen, Germany, Jun. 23-25, 2002, pp. 1-5.

*Primary Examiner* — David Vu
*Assistant Examiner* — Mouloucoulaye Inoussa
(74) *Attorney, Agent, or Firm* — Eschweiler & Potashnik, LLC

(57) ABSTRACT

A method of forming a package assembly includes forming a no-flow underfill layer on a substrate. The method further includes attaching a semiconductor die to the substrate. The semiconductor die comprises a bump and a molding compound layer in physical contact with a lower portion of the bump. An upper portion of the bump is in physical contact with the no-flow underfill layer.

20 Claims, 7 Drawing Sheets

Related U.S. Application Data

(60) Provisional application No. 61/590,255, filed on Jan. 24, 2012.

(51) Int. Cl.
  H01L 21/56 (2006.01)
  H01L 21/768 (2006.01)
  H01L 23/525 (2006.01)

(52) U.S. Cl.
  CPC ............. *H01L 24/02* (2013.01); *H01L 24/03* (2013.01); *H01L 24/05* (2013.01); *H01L 24/13* (2013.01); *H01L 24/16* (2013.01); *H01L 24/27* (2013.01); *H01L 24/29* (2013.01); *H01L 24/83* (2013.01); *H01L 24/92* (2013.01); *H01L 24/94* (2013.01); *H01L 2224/024* (2013.01); *H01L 2224/0239* (2013.01); *H01L 2224/02311* (2013.01); *H01L 2224/0347* (2013.01); *H01L 2224/0362* (2013.01); *H01L 2224/03612* (2013.01); *H01L 2224/03614* (2013.01); *H01L 2224/0401* (2013.01); *H01L 2224/05008* (2013.01); *H01L 2224/05073* (2013.01); *H01L 2224/05124* (2013.01); *H01L 2224/05147* (2013.01); *H01L 2224/05166* (2013.01); *H01L 2224/05187* (2013.01); *H01L 2224/05582* (2013.01); *H01L 2224/05611* (2013.01); *H01L 2224/05644* (2013.01); *H01L 2224/05647* (2013.01); *H01L 2224/05655* (2013.01); *H01L 2224/05666* (2013.01); *H01L 2224/05681* (2013.01); *H01L 2224/1146* (2013.01); *H01L 2224/11334* (2013.01); *H01L 2224/11849* (2013.01); *H01L 2224/131* (2013.01); *H01L 2224/13022* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16225* (2013.01); *H01L 2224/16227* (2013.01); *H01L 2224/27318* (2013.01); *H01L 2224/27334* (2013.01); *H01L 2224/27416* (2013.01); *H01L 2224/2919* (2013.01); *H01L 2224/73204* (2013.01); *H01L 2224/81024* (2013.01); *H01L 2224/81203* (2013.01); *H01L 2224/81801* (2013.01); *H01L 2224/81815* (2013.01); *H01L 2224/83192* (2013.01); *H01L 2224/83855* (2013.01); *H01L 2224/92125* (2013.01); *H01L 2224/94* (2013.01); *H01L 2924/12042* (2013.01); *H01L 2924/181* (2013.01); *H01L 2924/2076* (2013.01)

(58) Field of Classification Search
  CPC ............. H01L 24/94; H01L 2224/0239; H01L 2224/0347; H01L 2224/00
  USPC ....... 257/737, 738, 778, 780, 781, 739, 779; 438/108, 613, 614, 615, 545
  See application file for complete search history.

(56) References Cited

U.S. PATENT DOCUMENTS

| | | | |
|---|---|---|---|
| 6,369,451 B2 | 4/2002 | Lin | |
| 6,794,761 B2 | 9/2004 | Shi et al. | |
| 2004/0012930 A1* | 1/2004 | Grigg | H05K 3/3436 361/743 |
| 2004/0072387 A1* | 4/2004 | Hong | H01L 24/02 438/108 |
| 2006/0200985 A1* | 9/2006 | Workman | H01L 21/563 29/860 |
| 2007/0238220 A1* | 10/2007 | Lii | H01L 21/563 438/106 |
| 2010/0140760 A1* | 6/2010 | Tam | H01L 21/563 257/660 |
| 2011/0278736 A1* | 11/2011 | Lin | H01L 25/50 257/774 |
| 2012/0252168 A1* | 10/2012 | Nah | H01L 21/563 438/124 |
| 2013/0009307 A1* | 1/2013 | Lu et al. | 257/738 |
| 2013/0075139 A1* | 3/2013 | Wang | H01L 24/81 174/257 |
| 2013/0113094 A1* | 5/2013 | Wu | H01L 23/3171 257/737 |

* cited by examiner

METHOD OF FORMING PACKAGE ASSEMBLY

PRIORITY CLAIM

The present application is a divisional of U.S. application Ser. No. 13/427,787, filed Mar. 22, 2012, which claims priority of U.S. Provisional Application No. 61/590,255, filed Jan. 24, 2012, which are incorporated herein by reference in their entireties.

TECHNICAL FIELD

This disclosure relates to the fabrication of package assemblies and, more particularly, to the fabrication of package assemblies for semiconductor devices.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and a substrate or lead frame of a package. Structurally, a bump actually contains the bump itself and an "under bump metallurgy" (UBM) located between the bump and the I/O pad.

Wafer level chip scale packaging (WLCSP) is currently widely used because WLCSP is low cost and has relatively simple processes. In a typical WLCSP, post-passivation interconnect (PPI) lines such as redistribution lines (RDLs) are formed on passivation layers, followed by the formation of polymer films and bumps. A ball placement or a ball drop process is utilized in the WLCSP technology, but the ball drop performance is still a concern.

DETAILED DESCRIPTION

Figure 1:
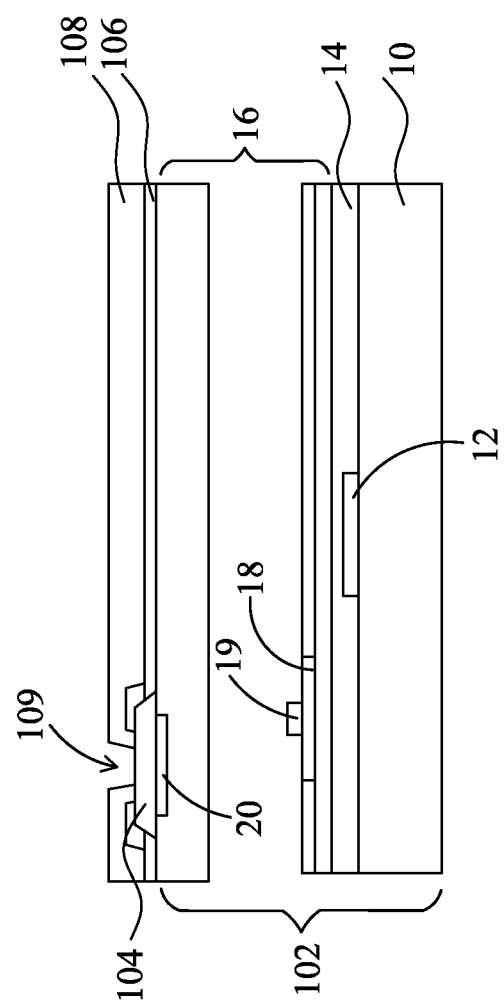
FIGS. 1-5 are cross-sectional views of a semiconductor die at various intermediate stages of a method of forming a semiconductor device in accordance with exemplary embodiments.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of bump structures for use with semiconductor devices. As will be discussed below, embodiments are disclosed that utilize a bump structure for the purpose of attaching one substrate to another substrate, wherein each substrate may be a die, wafer, interposer substrate, printed circuit board, packaging substrate, or the like, thereby allowing for die-to-die, wafer-to-die, wafer-to-wafer, die or wafer to interposer substrate or printed circuit board or packaging substrate, or the like. Throughout the various views and illustrative embodiments, like reference numerals are used to designate like elements.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-5 are cross sectional views of a semiconductor die at various intermediate stages of a method of forming a semiconductor device in accordance with some embodiments.

Referring first to FIG. 1, a semiconductor substrate 102 includes a substrate 10, an electrical circuitry 12, an interlayer dielectric (ILD) layer 14, inter-metal dielectric (IMD) layers 16 and the associated metallization layers.

A portion of the substrate 10 having electrical circuitry 12 formed thereon is shown, in accordance with some embodiments. The substrate 10 may comprise, for example, bulk silicon, doped or undoped, or an active layer of a semiconductor-on-insulator (SOI) substrate. The substrate 10 may be provided as a wafer level scale or a chip level scale. Other substrates, such as a multi-layered or gradient substrate may also be used.

Electrical circuitry 12 formed on the substrate 10 may be any type of circuitry suitable for a particular application. In some embodiments, the electrical circuitry 12 includes electrical devices formed on the substrate 10 having one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The ILD layer 14 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, the ILD layer 14 may comprise a plurality of dielectric layers. Contacts (not shown) may be formed through the ILD layer 14 to provide an electrical connection to the electrical circuitry 12.

One or more inter-metal dielectric (IMD) layers 16 and the associated metallization layers are formed over the ILD layer 14. Generally, the one or more IMD layers 16 and the associated metallization layers (such as metal lines 18 and vias 19) are used to interconnect the electrical circuitry 12 to each other and to provide an external electrical connection. The IMD layers 16 may be formed of a low-K dielectric material, such as FSG formed by PECVD techniques or high-density plasma CVD (HDPCVD), or the like, and may include intermediate etch stop layers. In some embodiments, one or more etch stop layers (not shown) may be positioned between adjacent ones of the dielectric layers, e.g., the ILD layer 14 and the IMD layers 16. Generally, the etch stop layers provide a mechanism to stop an etching process when forming vias and/or contacts. The etch stop layers are formed of a dielectric material having a different etch selectivity from adjacent layers, e.g., the underlying semiconductor substrate 10, the overlying ILD layer 14, and the overlying IMD layers 16. In some embodiments, etch stop layers may be formed of SiN, SiCN, SiCO, CN, combinations thereof, or the like, deposited by CVD or PECVD techniques.

In some embodiments, the metallization layers, including metal lines 18 and vias 19, may be formed of copper or copper alloys, or of other metals. Further, the metallization layers include a top metal layer 20 formed and patterned in or on an uppermost IMD layer to provide external electrical connections and to protect the underlying layers from various environmental contaminants. In some embodiments, the uppermost IMD layer is formed of a dielectric material, such as silicon nitride, silicon oxide, undoped silicon glass, and the like. In subsequent drawings, semiconductor substrate 10, electrical circuitry 12, ILD layer 14, and metallization layers 18 and 19 are not illustrated. In some embodiments, the top metal layer 20 is formed as a part of the top metallization layer on the uppermost IMD layer.

Thereafter, a contact pad 104 is formed and patterned to contact the top metal layer 20, or alternatively, electrically coupled to top metal layer 20 through a via. In some embodiments, the contact pad 104 may be formed of aluminum, aluminum copper, aluminum alloys, copper, copper alloys, or the like. One or more passivation layers, such as a passivation layer 106 are formed and patterned over the contact pad 104. In some embodiments, the passivation layer 106 may be formed of a dielectric material, such as undoped silicate glass (USG), silicon nitride, silicon oxide, silicon oxynitride or a non-porous material by any suitable method, such as CVD, PVD, or the like. The passivation layer 106 is formed to cover a peripheral portion of the contact pad 104, and to expose a central portion of the contact pad 104 through an opening in passivation layer 106. The passivation layer 106 may be a single layer or a laminated layer. In FIG. 1, a single layer of the contact pad 104 and the passivation layer 106 are shown for illustrative purposes only. As such, other embodiments may include any number of conductive layers and/or passivation layers.

Next, a first protective layer 108 is formed and patterned over the passivation layer 106. In some embodiments, the first protective layer 108 may be, for example, a polymer layer, which is patterned to form an opening 109, through which the contact pad 104 is exposed. In some embodiments, the polymer layer is formed of a polymer material such as an epoxy, polyimide, benzocyclobutene (BCB), polybenzoxazole (PBO), and the like, although other relatively soft, often organic, dielectric materials can also be used. The formation methods include spin coating or other methods. The first protective layer 108 has a thickness in a range between about 1 μm and about 10 μm. For example, a thickness between about 5 μm and about 8 μm.

Figure 2:
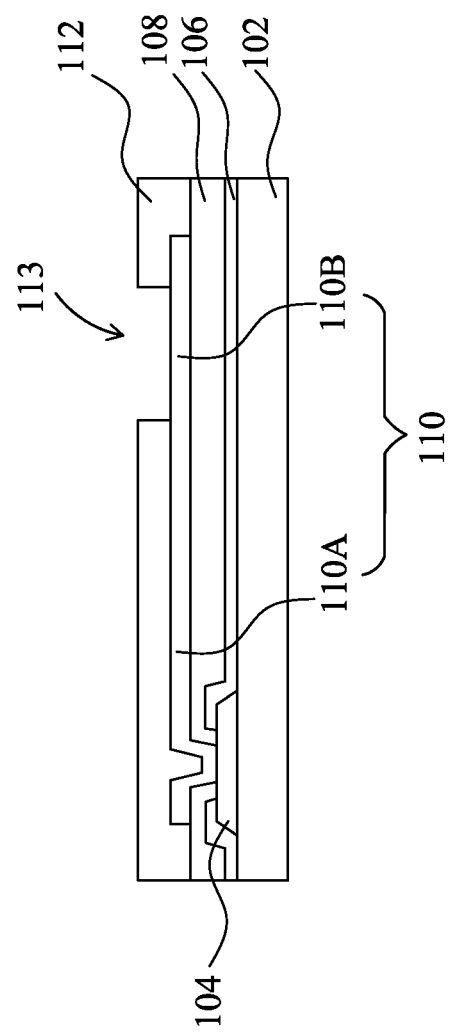

Referring to FIG. 2 at least one metallization layer 110 is formed on the first protective layer 108 and fills the opening 109. The metallization layer patterned as an interconnect layer, which is electrically connected to the contact pad 104 and may expose a portion of the underlying first protective layer 108. In at least an embodiment, the interconnect layer 110 is a post-passivation interconnect (PPI) layer 110, which may also functions as power lines, re-distribution lines (RDL), inductors, capacitors or any passive components. The PPI layer 110 includes an interconnect line region 110A and a landing pad region 110B. In some embodiments, the interconnect line region 110A and the landing pad region 110B may be formed simultaneously, and may be formed of a same conductive material. A bump feature will be formed over and electrically connected to the landing pad region 110B in subsequent processes. In some embodiments, the PPI layer 110 includes copper, aluminum, copper alloy, or other mobile conductive materials using plating, electroless plating, sputtering, chemical vapor deposition methods, and the like. In some embodiments, the PPI layer 110 includes a copper layer or a copper alloy layer. In the embodiment of FIG. 2, the landing region 110B is not directly over the contact pad 104. In other embodiments, through the routing of PPI layer 110, the landing pad region 110B is directly over the contact pad 104.

With reference to FIG. 2, a second protective layer 112 is then formed on the PPI layer 110. Using photolithography and/or etching processes, the second protective layer 112 is patterned to form an opening 113 exposing at least a portion of the landing pad region 110B of the PPI layer 110. The formation methods of the opening 113 may include lithography, wet or dry etching, laser drilling, and/or the like. In some embodiments, the second protective layer 112 is formed of a polymer layer, such as an epoxy, polyimide, benzocyclobutene (BCB), polybenzoxazole (PBO), and the like, although other relatively soft, often organic, dielectric materials may also be used. In some embodiments, the second protective layer 112 is formed of a non-organic material selected from un-doped silicate glass (USG), silicon nitride, silicon oxynitride, silicon oxide, and combinations thereof.

Figure 3:
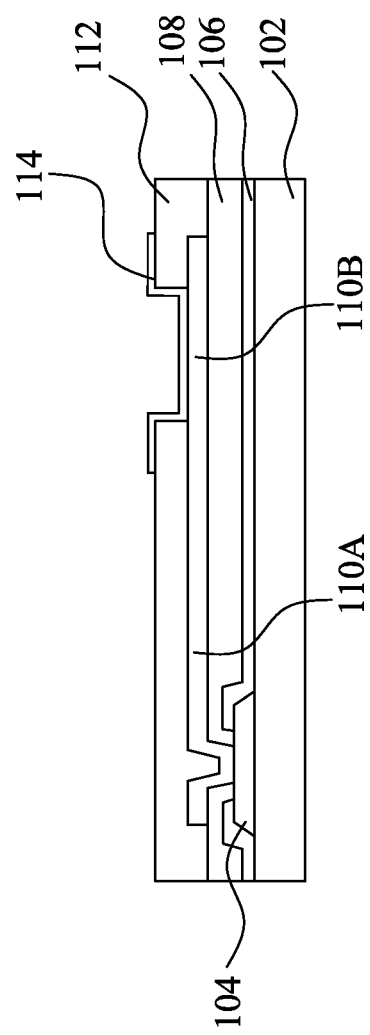

As shown in FIG. 3, an under-bump metallization (UBM) layer 114 is formed on the exposed portion of the landing pad region 110B. UBM layer 114 is formed so as to electrically connect to the PPI layer 110. In some embodiments, the UBM layer 114 may extend to a surface of the second protective layer 112. The formation methods of the UBM layer 114 include photoresist coating, lithography, wet or dry etching, and/or the like. In some embodiments, the UBM layer 114 includes at least one metallization layer comprising titanium (Ti), tantalum (Ta), titanium nitride (TiN), tantalum nitride (TaN), copper (Cu), copper alloys, nickel (Ni), tin (Sn), gold (Au), or combinations thereof. In some embodiments, the UBM layer 114 includes at least one Ti-containing layer and at least one Cu-containing layer.

Figure 4:
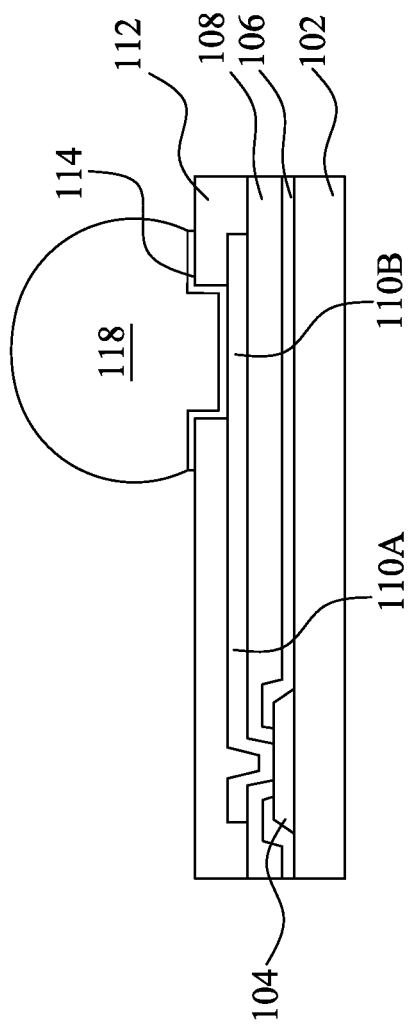

As shown in FIG. 4, a bump 118 is formed on the UBM layer 114. The bump 118 can be a solder bump, a Cu bump or a metal bump including Ni or Au. In some embodiments, the bump 118 is a solder bump formed by attaching a solder ball to the UBM layer 114 and then thermally reflowing the solder material. In an embodiment, the solder bump has a diameter greater than about 200 µm. In some embodiments, the solder bump includes a lead-free pre-solder layer, SnAg, or a solder material including alloys of tin, lead, silver, copper, nickel, bismuth, or combinations thereof. In some embodiments, the solder bump is formed by plating a solder layer using photolithography technologies followed by reflow processes.

Figure 5:
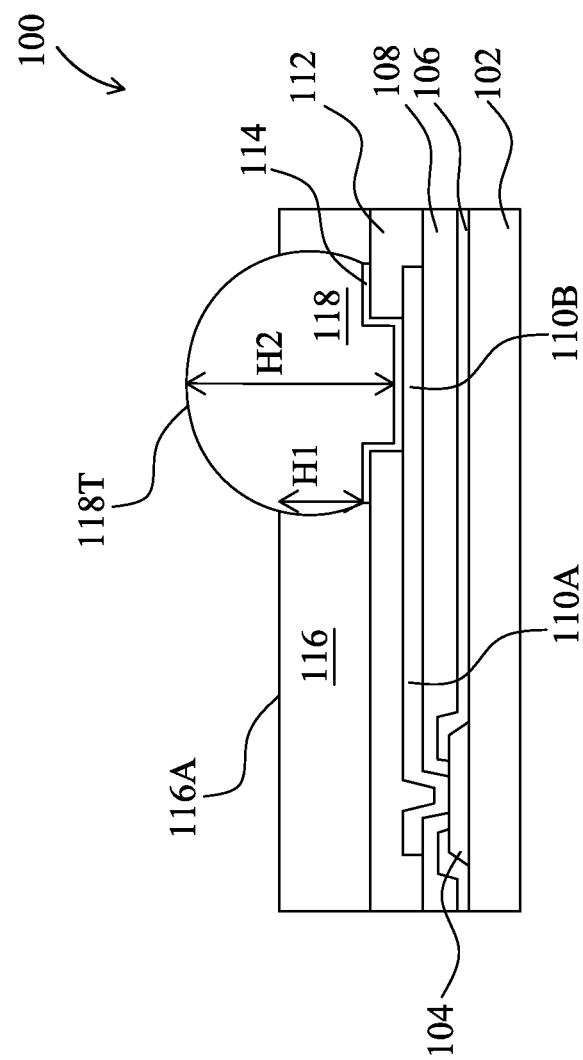

Next, as shown in FIG. 5, a molding compound layer 116 is applied on the second protective layer 112, where the bump 118 is partially buried in the molding compound layer 116. In some embodiments, the molding compound layer 116 is in physical contact with a lower portion of the bump 118, while an upper portion of the bump 118 is exposed and protrudes from a top surface 116A of the molding compound layer 116. In some embodiments, a top portion 118T of the bump 118 is higher than the top surface 116A of the molding compound layer 116. In some embodiments, the bump 118 is not polished after the reflow, and the top portion 118T of the bump 118 above the top surface 116A of the molding compound layer 116 may remain to have a rounded-like profile. The molding compound layer 116 may be in physical contact with the second protective layer 112 and/or the UBM layer 114. In some embodiments, a height (H1) of the bump 118 that is buried in the molding compound layer 116 may be between about ¼ to ¾ of a total height H2 of the bump 118. In at least one embodiment, the molding compound layer 116 is formed by applying a liquid molding compound and performing a curing process to cure and solidify the liquid molding compound. In some embodiments, a release film or a soft material may be applied on the liquid molding compound. Pressure is applied on the release film on the liquid molding compound, so that a portion of the bump 118 is pressed into release film. Furthermore, the pressure applied on the release film may push some of liquid molding compound downward. While the pressure is applied to the release film pushing against the bump and the liquid molding compound, a curing may be performed to cure and solidify liquid molding compound. After the solidification, the top portion 118T of the bump 118 is lower than the top surface 116A of molding compound layer 116. Thereafter, the release film is peeled off the molding compound layer 116, which is now in a solid form. The molding compound layer 116 residue remaining on the top portion 118T of the bump 118 is then etched. In the resulting structure, the molding compound layer 116 is formed with a portion of the bump 118 buried therein.

After the bump formation, for example, an encapsulant may be formed, a singulation process may be performed to singulate individual dies 100 and wafer-level or die-level stacking or the like may be performed. Embodiments may be used in many different situations. For example, embodiments may be used in a die-to-die bonding configuration, a die-to-wafer bonding configuration, a wafer-to-wafer bonding configuration, die-level packaging, wafer-level packaging, or the like. In some embodiments, the semiconductor die 100 shown in FIG. 5 is flipped upside down and attached to another substrate 200 as depicted in FIG. 6.

Figure 6:
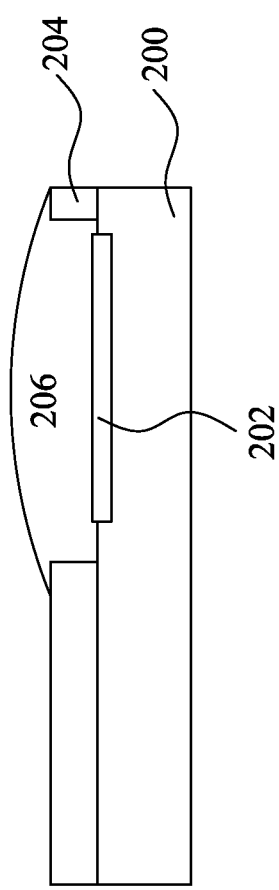
FIG. 6 is a cross-sectional view of a package substrate in accordance with an exemplary embodiment.

FIG. 6 is a cross-sectional view of a package substrate in accordance with an exemplary embodiment. In some embodiments, the substrate 200 may be a package substrate, board (e.g., a printed circuit board (PCB)), a wafer, a die, an interposer substrate, or other suitable substrate. The bump 118 of the semiconductor die 100 can be electrically coupled to the substrate 200 through various conductive attachment points. For example, a conductive region 202 is formed and patterned on the substrate 200. The conductive region 202 is a contact pad or a portion of a conductive trace, which is exposed by an opening in a mask layer 204. In some embodiments, the mask layer 204 is a solder resist layer formed and patterned on the substrate 200 to expose the conductive region 202. The mask layer 204 has a mask opening, which provides a window for jointing.

In at least on embodiment, a no-flow underfill (NUF) layer 206 is formed on the conductive region 202 within the window of the mask layer 204 prior to mounting the semiconductor die 100 to the substrate 200. The NUF material combines underfill and flux into a single material as a hybrid underfill-flux. The NUF layer 206 may act as fluxing agent for the solder reflow and form a solid during reflow cycle that reinforces the interconnects. Using the NUF material provides significant cost savings as it reduces the number of process steps used to bond the semiconductor die 100 to the substrate 200 and increases the throughput of the process. In some embodiments, the no-flow underfill material is deposited on the conductive region 202 using spin coating, dispensing, or lamination. The NUF material may be an epoxy resin having a high coefficient of thermal expansion (CTE) and high glass transition temperature. The volume deposition of the NUF material can be controlled to a thickness that covers a major portion of the conductive region 202 and exposes the remainder of the mask layer 204.

Figure 7:
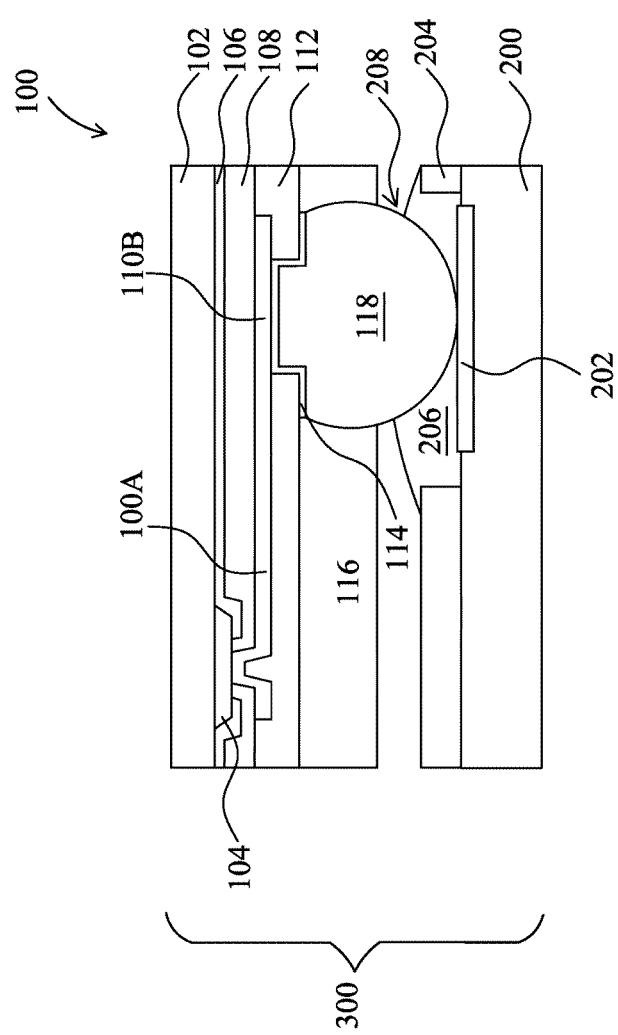
FIG. 7 is a cross-sectional view of a package assembly in accordance with an exemplary embodiment.

FIG. 7 is a cross-sectional diagram depicting an exemplary embodiment of a package assembly. In some embodiments, the semiconductor die 100 can be electrically coupled to the substrate 200, in which the bump 118 is in physical contact with the NUF layer 206 and electrically connected to the conductive region 202 so as to form an interconnected joint structure 208 between the die 100 and the substrate 200. In some embodiments, the upper portion of the bump 118 is in physical contact with the NUF layer 206, and the top portion 118T of the bump 118 is electrically connected to the conductive region 202. For example, the semiconductor die 100 can be attached to the substrate 200 by heating the substrate 200, dispensing the NUF layer 206 on the substrate, positioning the bump 118 of the semiconductor die 100 on/in the NUF layer 206 and then using a thermal-compression bonding process to reflow and attach the die 100 to the substrate 200. During reflow, the flux embedded in the NUF layer 206 activates and allows the solder bump to reflow and form the interconnected joint structure 208. After reflow, further curing of underfill may be performed. Therefore, the semiconductor die 100, the interconnected joint structure 208, and the substrate 200 are completed as a package assembly 300, or in the present embodiment, a flip-chip package assembly. By forming the molding compound layer 116 around the lower portion of the bump 118, the thermal cycling life of the package assembly can be enhanced. By applying the NUF layer 206 on the substrate 200, the solder ball drop performance can be further improved.

One aspect of this description relates to a method of forming a package assembly. The method includes forming a no-flow underfill layer on a substrate. The method further includes attaching a semiconductor die to the substrate. The semiconductor die comprises a bump and a molding compound layer in physical contact with a lower portion of the bump. An upper portion of the bump is in physical contact with the no-flow underfill layer.

Another aspect of this description relates to A method of forming a package assembly. The method includes forming a bump on a first substrate, and forming a molding compound layer on the first substrate, being in physical contact with a lower portion of the bump. The method further includes forming a no-flow underfill layer on a second substrate. The method further includes attaching the first substrate to the second substrate, wherein the second substrate comprises a no-flow underfill layer on a conductive region. An upper portion of the bump is in physical contact with the no-flow underfill layer and electrically connected to the conductive region so as to form an interconnected joint structure between the first substrate and the second substrate.

Still another aspect of this description includes a method of forming a package assembly. The method includes forming a no-flow underfill layer on a conductive region of a substrate, wherein a mask layer is over the substrate, and the no-flow underfill layer exposes at least a portion of the mask layer. The method further includes bonding a bump of a semiconductor die to the conductive region, wherein the semiconductor die comprises a molding compound layer in contact with a portion of the bump.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A method of forming a package assembly, the method comprising:
    forming a no-flow underfill layer covering a conductive region on a substrate;
    attaching a semiconductor die, comprising a bump and a molding compound layer in physical contact with a lower portion of the bump, to the substrate by submersing an upper portion of the bump into the no-flow underfill layer; and
    wherein a space is maintained between the molding compound layer and the no-flow underfill layer after attaching the semiconductor die to the substrate.

2. The method of claim 1, wherein the molding compound layer is formed by applying a liquid molding compound material and curing the liquid molding compound material.

3. The method of claim 1, wherein the upper portion of the bump is electrically connected to the conductive region of the substrate.

4. The method of claim 1, wherein the bump is a solder bump with a diameter greater than 200 µm.

5. A method of forming a package assembly, the method comprising:
    forming a bump on a first substrate;
    forming a molding compound layer on the first substrate, being in physical contact with a lower portion of the bump;
    forming a no-flow underfill layer on a second substrate; and
    attaching the first substrate to the second substrate, wherein the second substrate comprises the no-flow underfill layer on a conductive region, and attaching the first substrate to the second substrate comprises maintaining at least a portion of the molding compound layer separated from the no-flow underfill layer;
    wherein an upper portion of the bump is in physical contact with the no-flow underfill layer and electrically connected to the conductive region so as to form an interconnected joint structure between the first substrate and the second substrate.

6. The method of claim 5, wherein the step of forming the molding compound layer comprises:
    applying a liquid molding compound material over the bump;
    applying a pressure to make a top surface of the liquid molding compound material lower than the upper portion of the bump; and
    curing the liquid molding compound material.

7. The method of claim 5, wherein the first substrate comprises a semiconductor substrate.

8. The method of claim 5, further comprising forming a post-passivation interconnect (PPI) layer on the first substrate before forming the bump and the molding compound layer.

9. The method of claim 8, further comprising forming a polymer layer on the PPI layer before forming the bump and the molding compound layer.

10. The method of claim 8, further comprising forming a polymer layer on the first substrate before forming the PPI layer.

11. The method of claim 5, wherein the bump is a solder bump with a diameter greater than 200 µm.

12. A method of forming a package assembly, the method comprising:
    forming a mask layer over a substrate, wherein the mask layer has an opening exposing a conductive region of the substrate;
    forming a no-flow underfill layer on the conductive region of the substrate, wherein the no-flow underfill layer extends from within the opening to over the mask layer;
    bonding a bump of a semiconductor die having one or more semiconductor devices to the conductive region by submersing an upper portion of the bump into the no-flow underfill layer, wherein the semiconductor die comprises a molding compound layer in contact with a portion of the bump; and
    wherein a top surface of the no-flow underfill layer facing the molding compound layer is below a bottom surface of the molding compound layer facing the no-flow underfill layer after bonding the bump of the semiconductor die having one or more semiconductor devices to the conductive region.

13. The method of claim 12, wherein forming the no-flow underfill layer comprises forming the no-flow underfill layer by spin-coating, dispensing or laminating.

14. The method of claim 12, wherein forming the no-flow underfill layer comprises forming a hybrid underfill-flux layer.

15. The method of claim 12, wherein the no-flow underfill layer is formed prior to bonding the bump to the conductive region.

16. The method of claim 12, wherein bonding the bump to the conductive region comprises maintaining a space between the molding compound layer and the no-flow underfill layer.

17. The method of claim 12, further comprising:
forming an under bump metallurgy (UBM) layer between the bump and a second conductive region of the semiconductor die.

18. The method of claim 12, wherein the no-flow underfill layer extends from within the opening to over a top surface of the mask layer.

19. The method of claim 12, further comprising:
forming the no-flow underfill layer directly in contact with the conductive region.

20. The method of claim 12, wherein the no-flow underfill layer is formed to laterally contact the mask layer.

\* \* \* \* \*